(12) United States Patent
Fisher et al.

(10) Patent No.: US 6,741,517 B1
(45) Date of Patent: May 25, 2004

(54) FOUR PORT RAM CELL

(75) Inventors: Duncan M. Fisher, Mission Viejo, CA (US); Rajiv Gupta, Fullerton, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 0 days.

(21) Appl. No.: 10/113,684

(22) Filed: Mar. 29, 2002

(51) Int. Cl.[7] .............................. G11C 8/00; G11C 11/00; G11C 7/00

(52) U.S. Cl. .................. 365/230.05; 365/154; 365/156; 365/203

(58) Field of Search ............................ 365/230.05, 154, 365/156, 203, 205, 207, 208; 327/51

(56) References Cited

U.S. PATENT DOCUMENTS

| | | | | |
|---|---|---|---|---|
| 5,307,322 A | * | 4/1994 | Usami et al. | 365/230.05 |
| 5,422,857 A | * | 6/1995 | Ninomiya et al. | 365/230.05 |
| 5,590,087 A | * | 12/1996 | Chung et al. | 365/230.05 |
| 5,646,903 A | * | 7/1997 | Johnson | 365/230.05 |
| 5,901,104 A | * | 5/1999 | Shinmori | 365/230.05 |
| 6,104,654 A | | 8/2000 | Spence | 365/203 |
| 6,134,165 A | * | 10/2000 | Spence | 365/203 |
| 6,144,608 A | * | 11/2000 | Artieri | 365/230.05 |
| 6,288,969 B1 | * | 9/2001 | Gibbins et al. | 365/230.05 |
| 6,314,047 B1 | * | 11/2001 | Keay et al. | 365/230.05 |
| 6,385,122 B1 | * | 5/2002 | Chang | 365/230.05 |

* cited by examiner

Primary Examiner—Trong Phan
(74) Attorney, Agent, or Firm—Farjami & Farjami LLP

(57) ABSTRACT

According to one embodiment, a RAM array includes at least one RAM cell comprising a first access transistor driven by a first word line. When the first access transistor is turned on, it couples the RAM cell to a first bit line. The first bit line is connected to a single-ended sense amplifier such as an inverter. Similarly, the RAM cell comprises second, third, and fourth access transistors driven by respectively second, third, and fourth word lines. When the respective access transistors are turned on, they couple the RAM cell to respectively second, third, and fourth bit lines. The bit lines are connected to respective single-ended sense amplifiers such as inverters. In one embodiment, each of the first, second, third, and fourth access transistors is an NFET. The first, second, third, and fourth bit lines are coupled to respectively first, second, third, and fourth precharge transistors.

18 Claims, 3 Drawing Sheets

FOUR PORT RAM CELL

BACKGROUND OF THE INVENTION

1. Field of the Invention

The present invention is generally in the field of semiconductor circuits. More particularly, the present invention is in the field of random access memory (RAM) cells and arrays.

2. Related Art

The microprocessor, the heart of consumer electronic devices such as personal computers and personal digital assistants (PDA), continues to follow Moore's Law by doubling in speed approximately every eighteen months. Similarly, digital signal processors (DSP) utilized, for example, in broadband networks and digitized imaging applications, also continue to increase in speed. As a result, there is a continually increasing need for random access memory (RAM) arrays to provide increased access to the data required by these microprocessors and DSPs. Additionally, as the electronic devices that include the above microprocessors and DSPs continually decrease in size, there is also an increasing demand for RAM arrays that are smaller in size. Thus, RAM manufacturers are challenged to meet the demand for RAM arrays that provide increased data access and also take up less space. Further, as the demand for inexpensive consumer electronic devices continues to increase, RAM manufacturers face the additional challenge of reducing the cost of RAM arrays utilized in the consumer electronic devices.

By way of background, a RAM array comprises a large number of individual RAM cells. Data in the RAM array can be accessed or modified through one or more read or write ports. One approach used by RAM manufacturers to increase access to the data stored in the RAM cells is to increase the number of ports interfacing with the RAM array and allow the ports to be simultaneously read in a RAM read operation. U.S. Pat. No. 6,104,654, issued on Aug. 15, 2000, titled "High Speed Sensing of Dual Port Static RAM Cell" discloses a two port RAM array that allows data stored in the RAM array to be simultaneously read at two different ports.

In another approach, RAM manufacturers have provided a four port RAM array that allows data stored in the RAM array to be simultaneously read at four different ports. Each port in the four port RAM array is accessed by enabling a pair of access transistors in a RAM cell which couple the RAM cell to bit lines. The bit lines on each side of the RAM cell are coupled to the inputs of a differential sense amplifier. A change in voltage on the bit lines is recognized by the differential sense amplifier, and the data stored in the "four port RAM cell" is outputted by the differential sense amplifier. Although the conventional four port RAM cell described above allows data to be simultaneously read at four ports, eight access transistors must be enabled in the conventional four port RAM cell to provide access to all four ports in the RAM array. As a result, the conventional "four port RAM cell" has an undesirably large size.

Thus, there is a need in the art for an improved four port RAM cell. In particular, there is a need in the art for an improved four port RAM cell having a reduced size compared to a conventional four port RAM cell.

SUMMARY OF THE INVENTION

The present invention is directed to an improved four port RAM cell. The present invention addresses and resolves the need in the art for a four port RAM cell having a reduced size compared to a conventional four port RAM. Moreover, the present invention's four port RAM has other significant advantages resulting from its unique design which will be discussed in the detailed description section below.

According to one exemplary embodiment of the invention, a RAM array includes at least one RAM cell comprising a first access transistor driven by a first word line. When the first access transistor is turned on, it couples the RAM cell to a first bit line. The first bit line is connected to a single-ended sense amplifier such as an inverter. Similarly, the RAM cell comprises second, third, and fourth access transistors driven by respectively second, third, and fourth word lines. When the respective access transistors are turned on, they couple the RAM cell to respectively second, third, and fourth bit lines. The bit lines are connected to respective single-ended sense amplifiers such as inverters.

In one exemplary embodiment, each of the first, second, third, and fourth access transistors is an NFET. The first, second, third, and fourth bit lines are coupled to respectively first, second, third, and fourth precharge transistors. In one embodiment, the precharge transistors are NFETs, while in an alternative embodiment the precharge transistors are PFETs.

The invention's unique RAM cell results in a significant reduction in the number of RAM array transistors which results in a significantly smaller RAM array area, thus resulting in a reduced manufacturing cost. Moreover, the invention's unique RAM cell results in a substantially lower word line capacitance since each word line is loaded with half as many access transistors as compared to a word line in a conventional RAM array. The significant lowering of the word line capacitance results in faster word lines, lower power consumption, and lower noise induced on the RAM array bit lines. Other features and advantages of the present invention will become more readily apparent to those of ordinary skill in the art after reviewing the following detailed description and accompanying drawings.

DETAILED DESCRIPTION OF THE INVENTION

The present invention is directed to an improved four port RAM cell. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
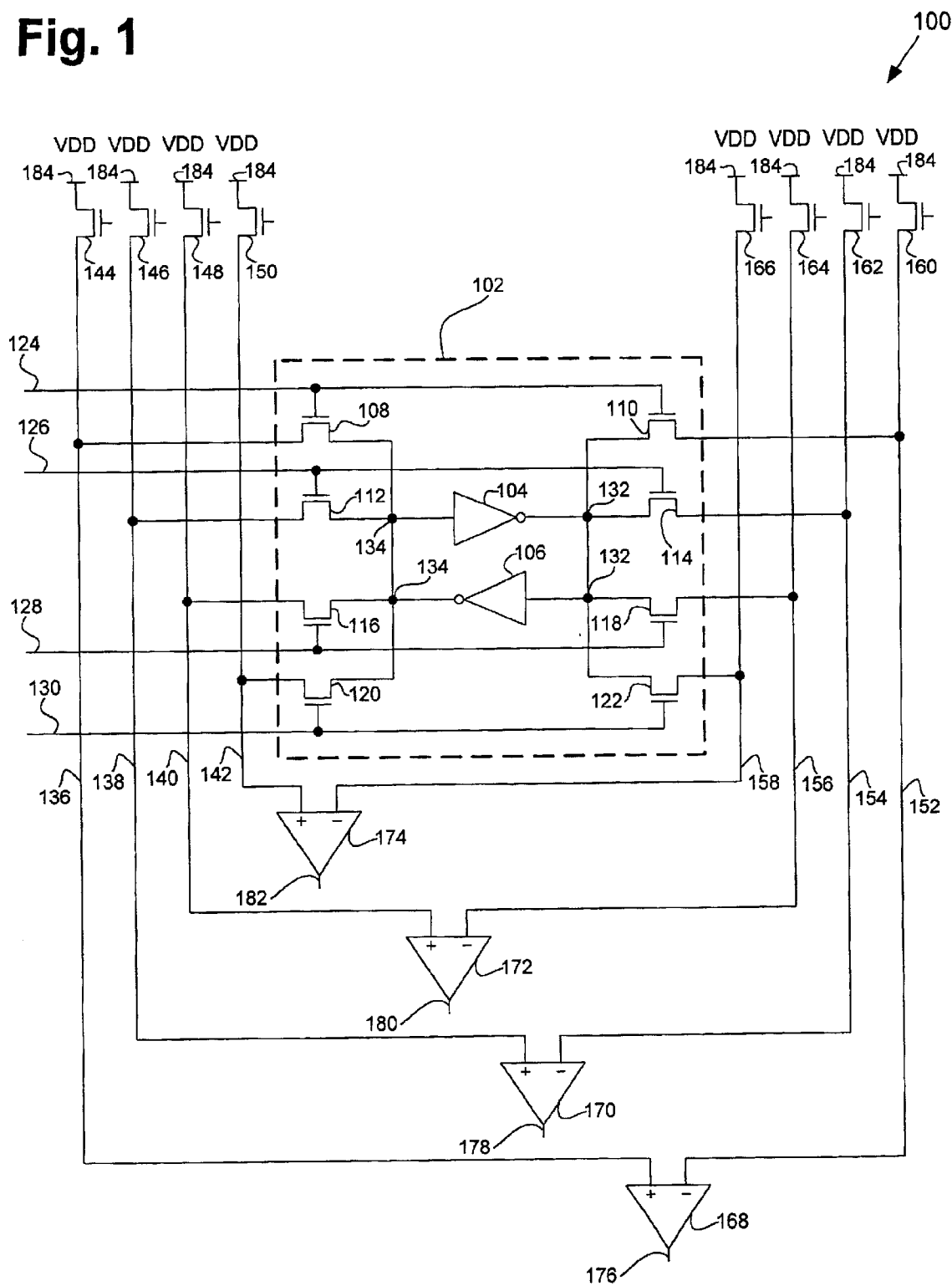
FIG. 1 illustrates a schematic diagram of a portion of a conventional exemplary four port RAM array.

FIG. 1 shows a schematic diagram of a portion of a known exemplary four port RAM array which is referred to simply as "four port RAM 100" for ease of reference in the present application. Four port RAM 100 in FIG. 1 includes four port RAM cell 102. Four port RAM cell 102 comprises inverters 104 and 106 and access transistors 108, 110, 112, 114, 116,118, 120, and 122. Access transistors 108, 110, 112, 114,116, 118, 120, and 122, for example, may be NFET (N-channel Field Effect Transistor) transistors. Access transistors 108 and 110 are coupled to word line 124, access transistors 112 and 114 are coupled to word line 126, access transistors 116 and 118 are coupled to word line 128, and access transistors 120 and 122 are coupled to word line 130.

In FIG. 1, the output of inverter 104 is connected to the input of inverter 106 at node 132, and the output of inverter 106 is connected to the input of inverter 104 at node 134. Thus, inverters 104 and 106 form a cross-coupled latch as known in the art. As shown in FIG. 1, bit lines 136, 138, 140, and 142 are coupled to access transistors 108, 112, 116, and 120, respectively. Access transistors 108, 112, 116, and 120 are also connected to node 134.

Also shown in FIG. 1, bit lines 136, 138, 140, and 142 are also connected to precharge transistors 144, 146, 148, and 150, respectively. Precharge transistors 144, 146, 148, and 150 are also coupled to voltage source 184, i.e. VDD. Further shown in FIG. 1, bit lines 152, 154, 156, and 158 are connected to access transistors 110, 114, 118, and 122, respectively. Access transistors 110, 114, 118, and 122 are also connected to node 132, and bit lines 152, 154, 156, and 158 are also connected to precharge transistors 160, 162, 164, and 166. Precharge transistors 160, 162, 164, and 166 are also coupled to voltage source 184 (VDD). In the present example, precharge transistors 144, 146, 148, 150, 160, 162, 164, and 166 are shown to be NFETs. However, it is known to one of ordinary skill in the art that the precharge transistors might also be PFETs.

Further shown in FIG. 1, bit lines 136, 138, 140, and 142 are connected to the "+" input of differential sense amplifiers 168, 170, 172, and 174, respectively, and bit lines 152, 154, 156, and 158 are connected to the "−" input of differential sense amplifiers 168, 170, 172, and 174, respectively. Differential sense amplifiers 168, 170, 172, and 174 provide outputs 176, 178, 180, and 182, respectively.

The operation of four port RAM cell 102 is now discussed. During a RAM read operation, any single word line, or any combination of word lines may be enabled. For example, word line 124, word lines 126 and 130, or word lines 124, 126, 128, and 130 may be enabled during a read cycle. Assume, for example, that word line 124 is enabled during a particular RAM read operation. It is noted that prior to the beginning of a RAM read operation, the precharge transistors are enabled so as to precharge their respective bit lines. More particularly and in relation to the present example, prior to the beginning of the RAM read operation, precharge transistor 144 is enabled to precharge bit line 136 and precharge transistor 160 is enabled to precharge bit line 152. By way of an example, if VDD is approximately 5.0 volts, bit lines 136 and 152 may be precharged to approximately 4.0 volts when the precharge transistors are NFETs. By way of another example, if VDD is approximately 5.0 volts, bit lines 136 and 152 may be precharged to approximately 5.0 volts when the precharge transistors are PFETs.

In the above example, when word line 124 is enabled access transistors 108 and 110 are turned on. Assume, for example, that a "1" is stored at node 134 and a "0" is stored at node 132 in RAM cell 102. When access transistor 108 is turned on, it connects node 134 to bit line 136. Bit line 136 remains high since bit line 136 was already precharged. When access transistor 110 is turned on, access transistor 110 connects node 132 to bit line 152. Bit line 152 is driven low by inverter 104 since the output of inverter 104 at node 132 is low, i.e. at bit value "0." Since bit line 136 and bit line 152 are connected to the "+" and "−" inputs, respectively, of differential sense amplifier 168, the change in voltage on bit line 136 and bit line 152 is detected by differential sense amplifier 168 in a manner known in the art. As a result, the data bit stored in exemplary four port RAM cell 102 is outputted at output 176. In the above example, a "1" is outputted at output 176 of differential sense amplifier 168.

Thus, when word line 124 is enabled, access transistors 108 and 110 are turned on, and the stored data bit in four port RAM cell 102 can be read at output 176 of differential sense amplifier 168. Similarly, when word lines 126, 128, or 130 are enabled, the appropriate access transistors are turned on, and the stored data bit in four port RAM cell 102 may be read at outputs 178, 180 or 182, respectively. Thus, by enabling the appropriate word lines, which turn on corresponding access transistors, the stored data bit in four port RAM cell 102 may be read at any combination of outputs 176, 178, 180, and 182.

In a RAM write operation, for example, word line 124 may be enabled to turn on access transistors 108 and 110. Access transistors 108 and 110, respectively, connect exemplary four port RAM cell 102 to bit line 136 and bit line 152 (which are precharged prior to the beginning of the RAM write operation). During a write operation, bit lines 136 and 152 are driven by a write circuitry (not shown in FIG. 1) to cause the desired data bit to be written into exemplary RAM cell 102.

Figure 2:
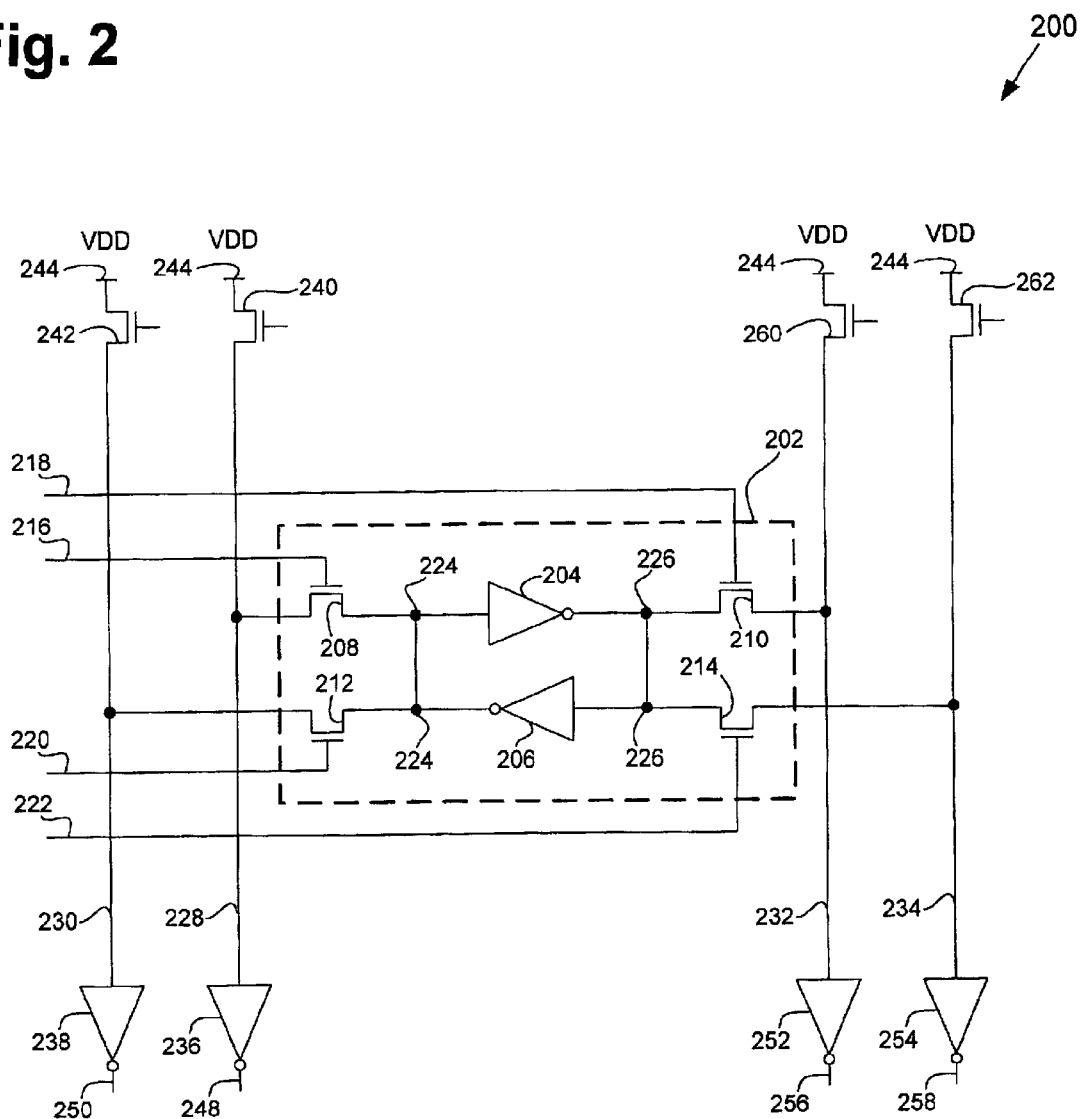
FIG. 2 illustrates a schematic diagram of a portion of an exemplary four port RAM array in accordance with one embodiment of the present invention.

FIG. 2 shows a schematic diagram of a portion of an exemplary four port RAM array in accordance with one embodiment of the present invention, which, in the present application, is referred to as "four port RAM 200" for ease of reference. Four port RAM 200 comprises four port RAM cell 202 which in turn consists of inverters 204 and 206 and access transistors 208, 210, 212, and 214. Inverters 204 and 206 are cross-coupled, i.e. the output of inverter 204 provides the input for inverter 206 and vice versa. An exemplary embodiment of inverters 204 and 206 are discussed in detail below in relation to FIG. 3. In the present embodiment of four port RAM cell 202, access transistors 208, 210, 212, and 214 are NFETs. The gates of access transistors 208, 210, 212, and 214 are connected to word lines 216, 218, 220, and 222, respectively. The drains of access transistors 208 and 212 are connected to node 224, which is both the output of inverter 206 and the input of inverter 204. The sources of access transistors 208 and 212 are connected to bit lines 228 and 230, respectively. Similarly, the drains of access transistors 210 and 214 are connected to node 226, which is both the output of inverter 204 and the input of inverter 206. The sources of access transistors 210 and 214 are connected to bit lines 232 and 234, respectively.

As shown in FIG. 2, bit lines 228 and 230 are connected to the inputs of inverters 236 and 238, respectively. In the present embodiment, inverters 236 and 238 function as "single-ended" sense amplifiers. In one embodiment, single-ended sense amplifiers more complex than inverters 236 and 238 can be used. Inverters 236 and 238 provide outputs 248 and 250, respectively. Bit lines 228 and 230 are also coupled to the sources of precharge transistors 240 and 242, respectively. In the present embodiment, precharge transistors 240 and 242 are NFETs. In another embodiment, precharge transistors 240 and 242 may be PFETs. The drains of precharge transistors 240 and 242 are connected to supply voltage 244, which is also referred to as "VDD" in the patent application. In one embodiment, supply voltage 244 can be approximately 3.0 to 5.0 volts. The gates of precharge transistors 240 and 242 are coupled to a precharge enable signal (not shown in FIG. 2).

Also shown in FIG. 2, bit lines 232 and 234 are connected to the inputs of inverters 252 and 254, respectively. In the present embodiment, inverters 252 and 254 function as "single-ended" sense amplifiers. In one embodiment, single-ended sense amplifiers more complex than inverters 252 and 254 can be used. Inverters 252 and 254 provide outputs 256 and 258, respectively. Bit lines 232 and 234 are also coupled to the sources of precharge transistors 260 and 262, respectively. In the present embodiment, precharge transistors 260 and 262 are NFETs. In another embodiment, precharge transistors 260 and 262 may be PFETs. The drains of precharge transistors 260 and 262 are connected to supply voltage 244. The gates of precharge transistors 260 and 262 are coupled to a precharge enable signal (not shown in FIG. 2).

The operation of four port RAM cell 202 will now be discussed. Referring to FIG. 2, four port RAM cell 202 is addressable through access transistors 208, 210, 212, or 214. In other words, four port RAM cell 202 is addressed when access transistors 208, 210, 212, or 214 are turned on by word lines 216, 218, 220, or 222, respectively. For example, when word line 216 makes a transition from low to high, access transistor 208 is turned on causing the value stored in four port RAM cell 202 to affect the voltage on bit line 228.

Prior to the beginning of a RAM read operation, the precharge transistors are turned on to precharge the bit lines in the RAM array to the value of supply voltage 244. For example, if precharge transistor 240 is an NFET as shown, prior to reading data in four port RAM cell 202 via access transistor 208, a precharge enable signal coupled to the gate of precharge transistor 240 goes high to turn on precharge transistor 240. Once turned on, precharge transistor 240 applies supply voltage 244, i.e. VDD, to bit line 228 to precharge bit line 228 to a voltage level close to the VDD voltage. In the present exemplary embodiment, bit lines 230 and 228 and bit lines 232 and 234 are precharged to a voltage level lower than supply voltage 244 since the precharge transistors are NFETs. However, in an alternative embodiment where the precharge transistors are PFETs, bit lines 230 and 228 and bit lines 232 and 234 are precharged to a voltage level substantially equal to supply voltage 244. It is noted that the bit lines in a RAM array are precharged to a preset voltage prior to a RAM read operation to, among other things, reduce the time required to sense the data present in the RAM cells being accessed.

Continuing with the above example, after bit line 228 is precharged to the voltage level of VDD, word line 216, which is coupled to the gate of access transistor 208, goes high to turn on access transistor 208 to enable the content of four port RAM cell 202 to be read. As soon as word line 216 goes high and turns on access transistor 208, bit line 228 is forced to a lower voltage or remains at the precharge voltage depending on whether a "0" or a "1," respectively, has been stored in four port RAM cell 202. For example, if a "0" has been stored in four port RAM cell 202, the precharge voltage on bit line 228 will not be discharged, and bit line 228 will remain high, i.e. a "1." The voltage level on bit line 228 will be inverted by inverter 236 and outputted as a "0" at output 248. By way of further example, if a "1" has been stored in four port RAM cell 202, the precharge voltage on bit line 228 will be forced to a lower voltage, i.e. discharged. When the voltage level on bit line 228 falls to a voltage level sufficiently low enough to trigger inverter 236, a "1" is outputted at output 248. In a similar manner described above, data stored in RAM cell 202 may be read by enabling all or any combination of access transistors 208, 210, 212, and 214. Thus, data can be read from four port RAM cell 202 simultaneously at four different outputs, i.e. outputs 248, 250, 256, and 258, in a single RAM read operation.

Figure 3:
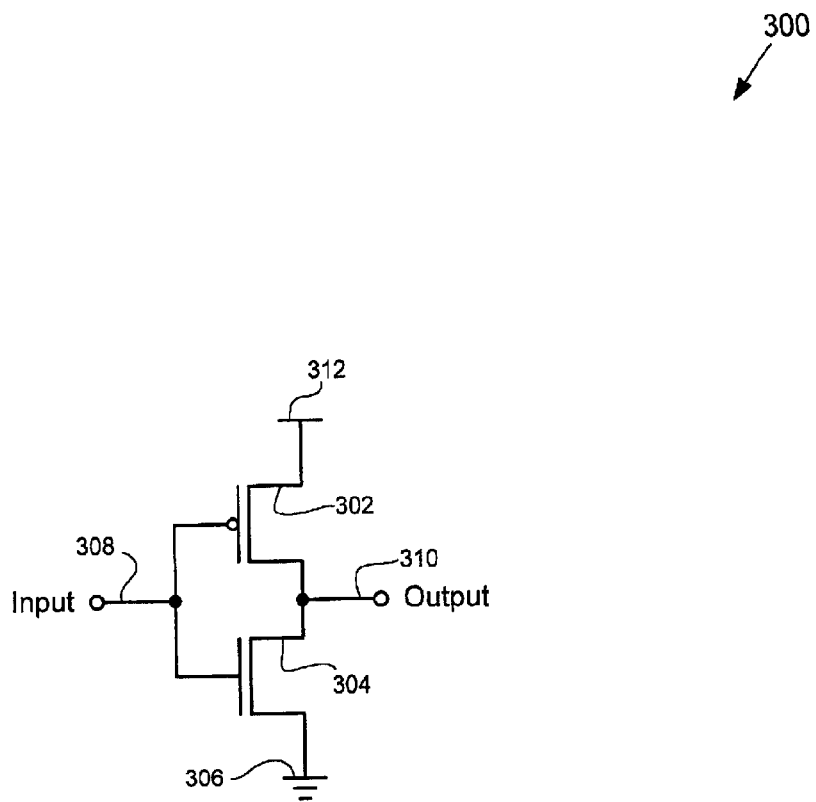
FIG. 3 illustrates a schematic diagram of an exemplary inverter in the exemplary four port RAM cell of FIG. 2.

FIG. 3 shows a schematic diagram of an exemplary RAM cell inverter in accordance with one embodiment of the present invention. In particular inverter 300 in FIG. 3 corresponds to inverters 204 and 206 in four port RAM cell 202 in FIG. 2. Inverter 300 includes PFET 302 and NFET 304. As shown in FIG. 3, the gates of NFET 304 and PFET 302 are coupled together to provide input 308. The source of NFET 304 is connected to ground 306, and the drain of NFET 304 is connected to the drain of PFET 302 to provide output 310. The source of PFET 302 is coupled to voltage source 312, such as VDD.

In the present invention's four port RAM cell 202 in FIG. 2, a first and a second inverter 300, i.e. inverters 204 and 206, are cross-coupled to form a latch. By way of background, the latch will retain one of two possible data values, i.e. either a "1" or a "0," as long as a pair of access transistors, such as access transistors 208 and 210, are not turned on to write new data into the latch. Data stored in the latch can be read by enabling an access transistor, such as access transistor 208, which couples the latch to a bit line, such as bit line 228. For example, if a "0" is stored in the latch, NFET 304 in the appropriate cross-couple inverter will drive precharged bit line 228 to a voltage sufficiently low to toggle output 248 of sensing inverter 236. By way of another example, if a "1" is stored in the latch, PFET 302 in the appropriate cross-couple inverter will maintain a high precharge value at bit line 228.

As noted above, the present invention's four port RAM cell 202 utilizes single-ended sense amplifiers, such as inverter 236, which are coupled to respective bit lines, such as bit line 228. In contrast, conventional four port RAM cell 102 in FIG. 1 utilizes differential sense amplifiers, such as sense amplifier 174, to detect voltage changes on the bit lines coupled to conventional four port RAM cell 102. Generally, single-ended amplifiers, such as sensing inverter 236 in FIG. 2, require a larger voltage swing on the bit lines and, as such, utilizing inverters as single-ended sense amplifiers to detect voltage swings on bit lines can result in a slower sensing operation. However, with the generally improved speed of transistors and reduced parasitic capacitances and resistances, and lower VDD voltages and availability of even lower precharge voltages through, for example, the use of NFET precharge transistors, the speed disadvantages of utilizing single-ended amplifiers, such as sensing inverter 236 in FIG. 2, for sensing bit line voltage swings are significantly reduced.

As discussed above, single-ended sense amplifiers, such as inverter 236 in FIG. 2, require a larger voltage swing on the bit line than differential sense amplifiers. By the same token, the present invention's four part RAM cell requires a stronger latch to drive single-ended inverters than the latches in a conventional four port RAM cell. Accordingly, the present invention's four part RAM cell requires transistors, such as transistors 302 and 304, in the latch inverters to be sufficiently large in size to effectively drive sensing inverters such as inverter 236.

As described above, according to four port RAM 200 of the present invention, data can be advantageously read from the four port RAM cell 202 at four outputs in a single RAM read operation by requiring only four access transistors, i.e. access transistors 208, 210, 212, and 214, to be independently enabled. In contrast, conventional exemplary four port RAM cell 102 in FIG. 1 requires eight access transistors, i.e. access transistors 108, 110, 112, 114, 116, 118, 120, and 122, to be enabled to read data simultaneously at four outputs, i.e. outputs 176, 178, 180, and 182, during a single RAM read operation. Thus, the present invention's four port RAM cell 202 requires four fewer access transistors than conventional exemplary four port RAM cell 102. As a result, the present invention advantageously achieves a four port RAM cell that requires a smaller area in a semiconductor chip than the area required by a conventional exemplary four port RAM cell. Manifestly, a RAM array comprising the present invention's four port RAM cells would require much less area in a semiconductor chip than a RAM array comprising conventional four port RAM cells. Furthermore, by reducing the number of access transistor, the present invention achieves a four port RAM cell that can be manufactured at a lower cost than a conventional four port RAM cell.

It is noted that each access transistor in a RAM cell adds capacitance to a respective word line, which detrimentally decreases the speed of the word line. Thus, by requiring a word line to drive only one access transistor instead of two access transistors as required in a conventional four port RAM cell, the present invention advantageously reduces the capacitance of the word line, and thus increases the speed of the word line. Furthermore, by decreasing the capacitance of the word lines, a smaller capacitive load is charged or discharged during the transition of the present invention's word lines. As such, the power consumed during word line transitions is lower in the present invention.

Moreover, the lower capacitance of the word lines creates less noise in the bit lines during transitions in the word lines since there is a smaller word line capacitance being discharged or charged, which would less significantly affect the precharged voltage present on the bit lines. As discussed above, the invention's word lines are less capacitive since each of the invention's word lines is loaded with half as many access transistors as the word lines in a conventional four port RAM cell. As such, transitions in the present invention's word lines create less noise in the bit lines relative to word lines in the conventional four port RAM cells.

It is appreciated by the above detailed description that the present invention provides an improved four port RAM cell. From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, bit lines coupled to the invention's four port RAM cell may be precharged to different voltage levels other than VDD. Further, the present invention's principles can also be applied to RAM cells having a number of ports greater than four. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, an improved four port RAM cell has been described.

What is claimed is:

1. A RAM array comprising:

a RAM cell including a first access transistor driven by a first word line, said first access transistor coupling said RAM cell to a first bit line, said first bit line being connected to a first single-ended sense amplifier, said first access transistor being connected to a first node of said RAM cell;

said RAM cell including a second access transistor driven by a second word line, said second access transistor coupling said RAM cell to a second bit line, said second bit line being connected to a second single-ended sense amplifier, said second access transistor being connected to said first node of said RAM cell;

said RAM cell including a third access transistor driven by a third word line, said third access transistor coupling said RAM cell to a third bit line, said third bit line being connected to a third single-ended sense amplifier, said third access transistor being connected to a second node of said RAM cell;

said RAM cell including a fourth access transistor driven by a fourth word line, said fourth access transistor coupling said RAM cell to a fourth bit line, said fourth bit line being connected to a fourth single-ended sense amplifier, said fourth access transistor being connected to said second node of said RAM cell;

wherein said first, second, third, and fourth word lines are coupled only to respectively said first, second, third, and fourth access transistors in said RAM cell, wherein data can be read simultaneously at respective outputs of said first, second, third, and fourth single-ended sense amplifiers by enabling respectively said first, second, third, and fourth access transistors.

2. The RAM array of claim 1 wherein each of said first, said second, said third, and said fourth access transistors is an NFET.

3. The RAM array of claim 1 wherein said first, second, third, and fourth bit lines are coupled to respectively first, second, third, and fourth precharge transistors.

4. The RAM array of claim 3 wherein each of said first, second, third, and fourth precharge transistors is an NFET.

5. The RAM array of claim 3 wherein each of said first, second, third, and fourth precharge transistors is a PFET.

6. The RAM array of claim 1 wherein each of said first, second, third, and fourth single-ended sense amplifiers is an inverter.

7. A RAM array comprising:

a first inverter and a second inverter, said first inverter having an output coupled to an input of said second inverter and said second inverter having an output coupled to an input of said first inverter;

a first access transistor and a second access transistor, said first and said second access transistors connected to said output of said first inverter, said output of said first inverter being coupled only to said first and second access transistors and said input of said second inverter;

a third access transistor and a fourth access transistor, said third and said fourth access transistors connected to said output of said second inverter, said output of said second inverter being coupled only to said third and fourth access transistors and said input of said first inverter;

wherein said first access transistor is coupled to a first word line, said second access transistor is coupled to a second word line, said third access transistor is coupled to a third word line, and said fourth access transistor is coupled to a fourth word line;

wherein said first, second, third, and fourth access transistors are coupled to respectively first, second, third, and fourth bit lines;

wherein said first, second, third, and fourth bit lines are coupled to respectively first, second, third, and fourth single-ended sense amplifiers;

wherein said first, second, third, and fourth word lines are coupled only to respectively said first, second, third, and fourth access transistors, wherein data can be read simultaneously at respective outputs of said first, second, third, and fourth single-ended sense amplifiers by enabling respectively said first, second, third, and fourth access transistors.

8. The RAM array of claim 7 wherein each of said first, said second, said third, and said fourth access transistors is an NFET.

9. The RAM array of claim 7 wherein said first, second, third, and fourth bit lines are coupled to respectively first, second, third, and fourth precharge transistors.

10. The RAM array of claim 9 wherein each of said first, second, third, and fourth precharge transistors is an NFET.

11. The RAM array of claim 7 wherein each of said first, second, third, and fourth precharge transistors is a PFET.

12. The RAM array of claim 7 wherein each of said first, second, third, and fourth single-ended sense amplifiers is an inverter.

13. A RAM array comprising:

a first word line coupled only to a first access transistor in a RAM cell, said first access transistor coupled to an input of a first inverter and an output of a second inverter in said RAM cell;

a second word line coupled only to a second access transistor in said RAM cell, said second access transistor coupled to said input of said first inverter and said output of said second inverter;

a third word line coupled only to a third access transistor in said RAM cell, said third access transistor coupled to an input of said second inverter and an output of said first inverter;

a fourth word line coupled only to a fourth access transistor in said RAM cell, said fourth access transistor coupled to said input of said second inverter and said output of said first inverter;

wherein said first, second, third, and fourth access transistors are coupled to respectively first, second, third, and fourth bit lines wherein said first, second, third, and fourth bit lines are coupled to respectively first, second, third, and fourth single-ended sense amplifiers;

wherein data can be read simultaneously at respective outputs of said first, second, third, and fourth single-ended sense amplifiers by enabling respectively said first, second, third, and fourth access transistors.

14. The RAM array of claim 13 wherein each of said first, said second, said third, and said fourth access transistors is an NFET.

15. The RAM array of claim 13 wherein said first, second, third, and fourth bit lines are coupled to respectively first, second, third, and fourth precharge transistors.

16. The RAM array of claim 15 wherein each of said first, second, third, and fourth precharge transistors is an NFET.

17. The RAM array of claim 15 wherein each of said first, second, third, and fourth precharge transistors is a PFET.

18. The RAM array of claim 13 wherein each of said first, second, third, and fourth single-ended sense amplifiers is an inverter.

* * * * *